United States Patent
Takizawa (10) Patent No.: US 7,522,265 B2
(45) Date of Patent: Apr. 21, 2009

(54) OPTICAL ALIGNER USING A COMPENSATION LIGHT

(75) Inventor: Masaharu Takizawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 469 days.

(21) Appl. No.: 11/478,692

(22) Filed: Jul. 3, 2006

(65) Prior Publication Data
US 2007/0008510 A1    Jan. 11, 2007

(30) Foreign Application Priority Data
Jul. 5, 2005    (JP)    ............................. 2005-196553

(51) Int. Cl.
G03B 27/72    (2006.01)
G03B 27/54    (2006.01)

(52) U.S. Cl. .......................................... 355/69; 355/67

(58) Field of Classification Search .................... 355/67, 355/69, 53; 430/5
See application file for complete search history.

(56) References Cited

U.S. PATENT DOCUMENTS

2007/0139637 A1*   6/2007   Troost et al. ................... 355/72

FOREIGN PATENT DOCUMENTS

JP    2004-062088    2/2004

* cited by examiner

Primary Examiner—Peter B Kim
(74) Attorney, Agent, or Firm—McGinn IP Law Group, PLLC (57) ABSTRACT

An optical aligner includes a light source for generating an exposure light, an irradiation optical system for irradiating the exposure light onto a reticle, a projection optical system for transmitting the exposure light passed by the reticle to project the image of the reticle onto a photoresist mask, and a compensation optical system for generating a compensation light incident onto the reticle. The reticle reflects the compensation light in the light-shield area of the reticle to be incident onto the photoresist film. The compensation light compensates a flare light generated by the reticle from the exposure light to form a uniform pattern on the wafer.

11 Claims, 10 Drawing Sheets

OPTICAL ALIGNER USING A COMPENSATION LIGHT

BACKGROUND OF THE INVENTION (a) Field of the Invention

The present invention relates to optical aligner using a compensation light and, more particularly, to an optical aligner suitably used for patterning a photoresist film on a semiconductor wafer.

(b) Description of the Related Art

In a photolithographic process used in fabricating a semiconductor device, a photoresist film is formed on an object film on a semiconductor wafer, followed by exposure of the photoresist film by using an optical aligner and development thereof to form a photoresist pattern on the photoresist film. The object film is then patterned using the photoresist pattern as a mask, to allow the object film to have a desired pattern. In the current photolithographic process, the reduction in the design rule of the semiconductor devices necessarily requires a higher-accuracy optical aligner.

Figure 16:
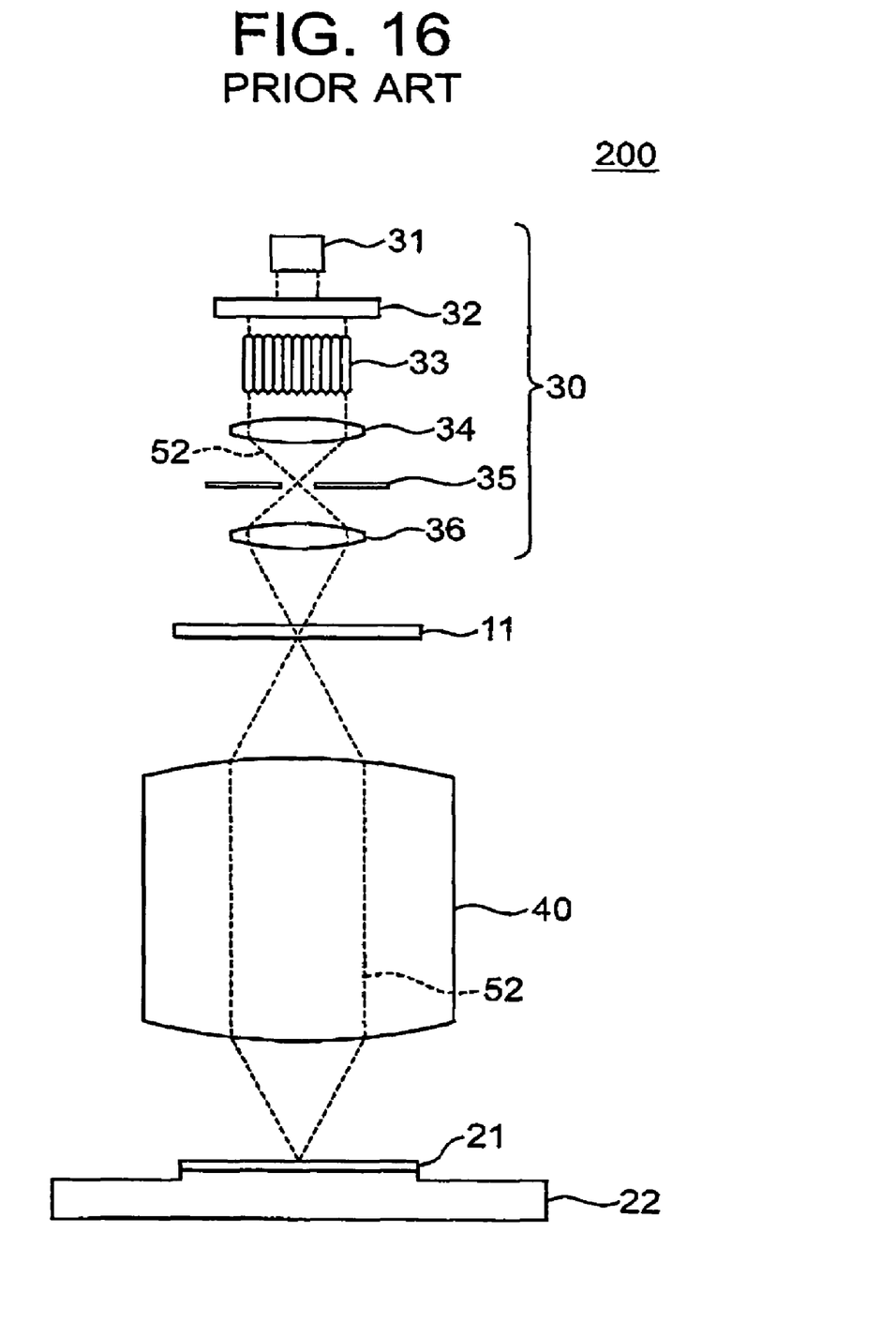
FIG. 16 is a sectional view of a conventional optical aligner.

FIG. 16 shows an outline of a conventional optical aligner in a sectional view thereof. The optical aligner 200 projects the image of a reticle 11 onto a wafer 21 mounted on a wafer stage 22 by using an exposure light. The wafer 21 includes a photoresist film made of a photoreceptor such as photoresist.

The optical aligner 200 includes an irradiation optical system 30 which irradiates an exposure light 52 irradiated by a light source 31 onto the reticle 11, and a projection optical system 40 which transmits the exposure light 52 passed by the reticle 11 onto the front face of the wafer 21 to project the image of the reticle 11 onto the wafer. The irradiation optical system 30 and the projection optical system 40 each include a variety of optical instruments such as optical lenses 32 to 34, 36 and a diaphragm 35.

In the conventional optical aligner 200, there is a problem in that a flare light occurs from the exposure light 52 due to diffraction of part of the exposure light in the reticle 11 and is incident onto the wafer 21 as a noise light. The flare light has a variety of light intensities on the surface of the wafer 21 depending on the ratio (opening ratio) of the transparent area to the total area of the circuit patterns on the reticle. For this reason, the resist pattern formed on the photoresist film of the wafer incurs a significant range of variation in the dimensions of the photoresist pattern after the development of the photoresist film, reflecting the variation of the light intensities of the flare light. The advance of the technique for achieving a smaller design rule in the semiconductor devices intensifies the influence by the flare light, which adversely affects on the dimensions of the photoresist pattern.

The flare light originates from a variety of factors, such as ununiform refractive index within the lens, unavoidable error in the shape of the lens surface, reflection on the wafer surface or lens surface, impurities adhered onto the lens surface. Thus, the measures have been taken heretofore to reduce the flare light as by improving the aberration, coating the lens surface and improving the machining accuracy for the lens surface.

Since the optical intensity of the flare light during the exposure is increased together with a smaller design rule, it is difficult to suppress the influence by the flare light while using the conventional techniques. For example, if an ArF excimer laser having an emission wavelength of 193 nm is used as the exposure light, the optical intensity of the flare light will be around ½ of the optical intensity of the exposure light on the wafer. There have been some reports on the fact where the variation of the dimensions in the photoresist pattern varies the line width in the semiconductor device to significantly degrade the product yield thereof.

Patent Publication JP-2004-62088A describes a technique for suppression of the flare light generated in the vicinity of a circuit pattern by forming a dummy pattern on the reticle in the vicinity of the circuit pattern.

The dummy pattern, if disposed in a space between adjacent circuit patterns, reduces the variation in the ratio of the transparent area to the total area including the transparent area and the opaque area in the reticle. It is noted that this technique is only effective in the case where a local flare light occurs having a smaller range of variation in the optical intensity, due to the restriction on the size or shape of the dummy pattern. That is, the flare light cannot be effectively suppressed in the entire pattern area of the reticle.

SUMMARY OF THE INVENTION

In view of the above problem in the conventional technique, it is an object of the present invention to provide an optical aligner which is capable of suppressing the variation in the dimensions in the resist pattern caused by the flare light to thereby suppress the variation in the line width of the resultant semiconductor device.

The present invention provides an optical aligner including: a light source for generating an exposure light; an irradiation optical system for irradiating the exposure light onto a mask having a light-shield area and a transparent area; a projection optical system for transmitting the exposure light passed by the mask toward a photoreceptor to thereby project an image of the mask onto the photoreceptor; and a compensation optical system for transmitting a compensation light onto the photoreceptor, wherein the compensation light has a first optical intensity distribution different from a second optical intensity distribution of a flare light generated from the exposure light.

The present invention also provides a method including the steps of: irradiating an exposure light onto a mask having a light-shield area and a transparent area, to project an image of the mask onto a photoreceptor; and irradiating a compensation light onto the photoreceptor, wherein the compensation light has a first optical intensity distribution different from a second optical intensity distribution of a flare light generated from the exposure light.

In accordance with the optical aligner and the method of the present invention, the compensation light compensates the flare light generated by the pattern of the mask from the exposure light, thereby providing a uniform pattern irrespective of the generation of the flare light.

PREFERRED EMBODIMENT OF THE INVENTION

Now, the present invention is more specifically described with reference to accompanying drawings, wherein similar constituent elements are designated by similar reference numerals throughout the drawings.

Figure 1:
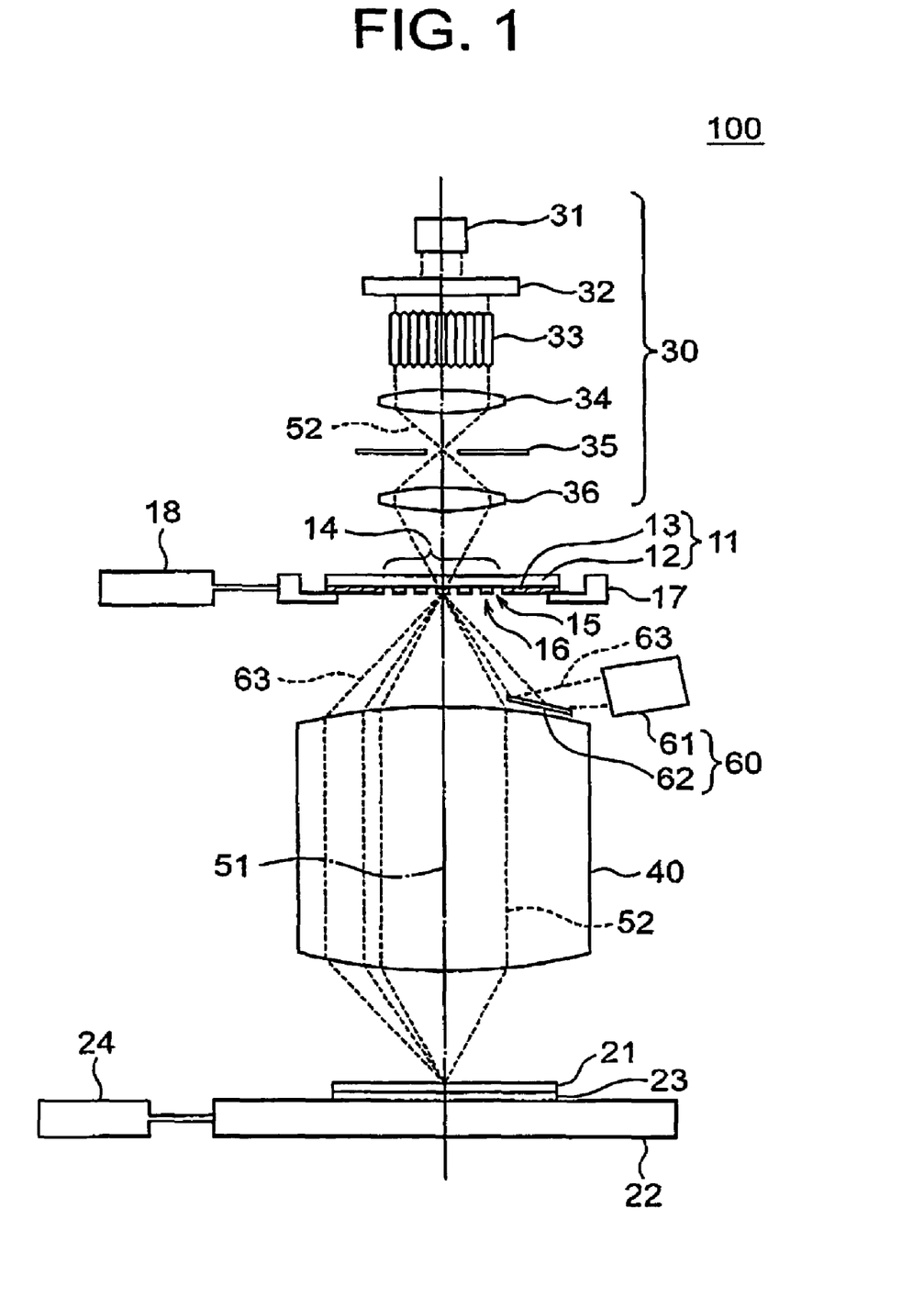
FIG. 1 is a sectional view of an optical aligner according to an embodiment of the present invention.

FIG. 1 shows an optical aligner according to an embodiment of the present invention. The optical aligner, generally designated by numeral 100, is used for projecting the image of a reticle 11 onto the surface of a wafer 21 by using an exposure optical system. The wafer 21 includes thereon a positive photoresist film, wherein the exposure of a portion of the photoresist film to the light allows the portion to be soluble in a developing solution and removed thereby after the development of the photoresist film.

The reticle 11 includes a transparent substrate 12, and a light-shield film 13 formed on bottom surface of the transparent substrate 12 and made of chromium having a light transmission factor of substantially zero percent. The reticle 11 includes a central pattern area 14 and a peripheral light-shield area 16 formed by a light-shield film 13, the central pattern area 14 including a plurality of stripe openings 15 which constitute a transparent area.

The reticle 11 is mounted on a reticle stage 17, with the surface of the transparent substrate 12 on which the light-shield film 13 is formed being directed downward. The reticle stage 17 has a shape of frame which exposes therethrough the pattern area 14 of the reticle 11. The reticle stage 17 is driven by a stage driver 18 for a swivel movement in the horizontal direction.

The wafer 21 is fixed onto a wafer holder 23 mounted on a wafer stage 22, which is driven by a stage driver 24 in the X-Y directions.

The exposure optical system includes an irradiation optical system 30, a projection optical system 40 and a compensation optical system 60. The irradiation optical system 30 includes a light source 31 and associated optical elements for irradiating the exposure light 52 emitted by the light source 31 onto the reticle 11. The projection optical system 40 includes optical elements including an objective lens (not shown) for projecting the exposure light 52 passed by the reticle 11 onto the surface of the wafer 21. The exposure light 52 forms the image of the pattern of the reticle 11 on the surface of the wafer 21.

The irradiation optical system 30 includes a collimator lens 32, a fly-eye lens 33, a first relay lens 34, a field-adjustment diaphragm 35, and a second relay lens 36. The light source 31 is an ArF excimer laser having an emission wavelength of 193 nm.

The exposure light 52 emitted by the light source 31 is converted by the collimator lens 32 into a parallel light, the intensity of which is equalized by the fly-eye lens 33 within the plane normal to the optical axis 51 of the exposure light 52. The exposure light 52 passed by the fly-eye lens 33 is condensed by the first relay lens 34, the spot diameter of the exposure light 52 is determined by the field-adjustment diaphragm 35, and the resultant exposure light 52 is diffused and incident onto the second relay lens 36. The second relay lens 36 condenses the exposure light 52 on the pattern of the reticle 11.

The exposure light 52 passed by the stripe openings or transparent area 15 of the reticle 11 is diffused and incident onto the projection optical system 40. The projection optical system 40 allows the exposure light 52 to advance parallel to the optical axis 51, and condenses the exposure light 52 on the surface of the wafer 21 so as to focus the image of the pattern of the reticle 11 onto the surface of the wafer 21.

The compensation optical system 60 irradiates a compensation light having an optical intensity distribution defining a spatial phase opposite to that of the flare light onto the wafer 21. The compensation optical system 60 is disposed in the vicinity of the projection optical system 40, and includes a light source 61 for emitting a compensation light, and a mirror 62 for reflecting the compensation light toward the bottom surface of the reticle 11. The light source 61 is configured by a Xe2 dielectric-barrier discharge lamp having an emission wavelength of 172 nm. The other optical elements for the compensation optical system 60 are configured by the optical elements in the projection optical source 40.

The compensation light 63 emitted by the compensation light source 61 is reflected by the mirror 62 and incident onto the reticle 11. The reticle 11 allows the compensation light 63 incident onto the openings 15 to pass through the transparent substrate 12, and dispersing the resultant compensation light toward outside of the optical aligner 100. The reticle 11 reflects the compensation light 63 incident onto the light-shield area 16 in an amount corresponding to the reflectance of the light-shield film 13 toward the projection optical system 40. The thus reflected compensation light 63 is incident onto the projection optical system 40 in the direction away from the optical axis 51 by an angle equal to the angle between the optical axis 51 and the compensation light 63 reflected by the mirror 62. The compensation light 63 advances within the projection optical system 40 parallel to the optical axis 51, and is condensed and incident onto the surface of the wafer 21 together with the exposure light 52 and flare light.

Since the projection optical elements of the compensation optical system 60 are configured by optical elements in the projection optical system 40, the compensation light 63 preferably has a wavelength corresponding to, or in the vicinity of, the wavelength of the exposure light in order to focus the compensation light 63 on the surface of the wafer 21. As for the relationship with the flare light, the compensation light 63 need not be focused with a precise accuracy on the wafer surface because the flare light has a relatively wide range of wavelength. Thus, the wavelength of the compensation light 63 may be different from the wavelength of the exposure light 52 to some extent.

For example, in the present embodiment, an ArF excimer laser having a wavelength of 193 nm or a KrCl dielectric-barrier discharge lamp having a wavelength of 222 nm may also be used in place of the Xe2 dielectric-barrier discharge lamp. The Xe2 dielectric-barrier discharge lamp is preferable because it is comparatively is cheap.

In the optical aligner 100 of the present embodiment, the flare light and compensation light 63 are projected onto the wafer 21 as a noise light in addition to the exposure light 52. The flare light passing through the reticle 11 to be incident onto the wafer surface has a higher optical intensity in the central openings 15 having a higher opening ratio than in the peripheral openings 15 having a lower opening ratio. The term "opening ratio" used herein means the ratio of the transparent area (stripe openings) 15 to the sum of the transparent area 15 and the masked area.

On the other hand, the compensation light 63 reflected by the masked area 16 of the reticle 11 to be incident onto the wafer surface has a lower optical intensity in the masked area 16 having a higher opening ratio than in the masked area 16 having a lower opening ratio.

More specifically, the compensation light 63 incident onto the wafer surface has an optical intensity distribution which is opposite to the optical intensity distribution of the flare light. This opposite relationship is inherent and does not depend on the circuit pattern of the reticle 11. Thus, the optical intensity of the compensation light 63 is adjusted at a range corresponding to the optical intensity of the flare light, and incident onto the wafer surface, whereby the wafer surface receives the overall light having a uniform optical intensity in the area corresponding to the stripe openings of the reticle 11. This suppresses the range of variation in the dimensions of the resist pattern, thereby suppressing the range of variation in the line width of the resultant semiconductor device.

Figure 4:
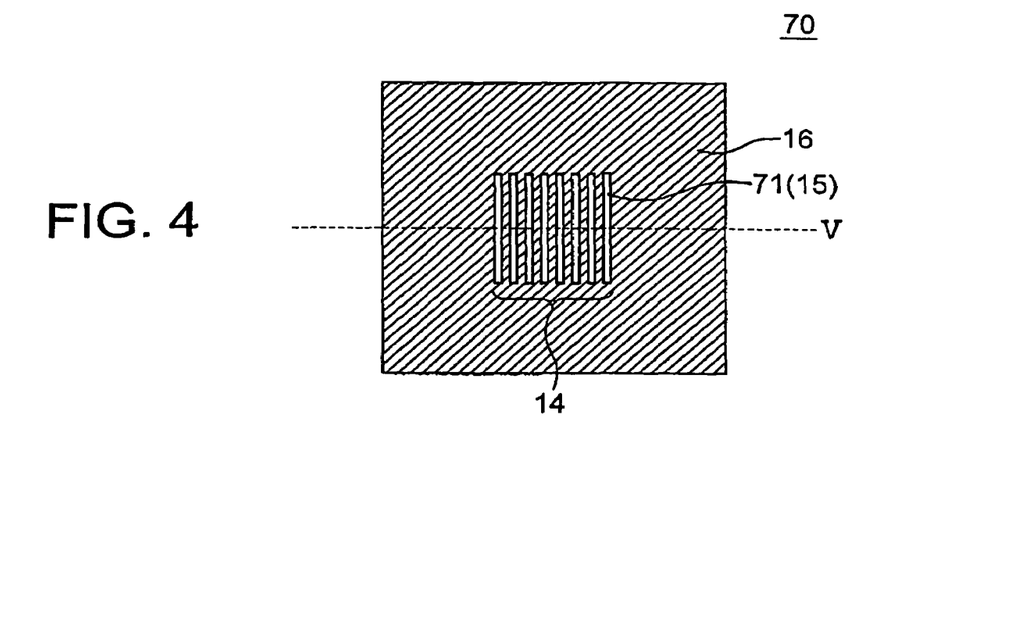
FIG. 4 is a top plan view of an example of the reticle shown in FIG. 1.

As a practical example for exposure using the optical aligner of FIG. 1, it is assumed here that a reticle 70 shown in FIG. 4 is used as the reticle 11 in FIG. 1. The reticle 70 includes a peripheral light-shield area 16 and a central pattern area 15, which includes therein a plurality of stripe openings 71 arranged in the direction normal to the lengthwise direction of the stripe openings at a specified pitch. The space between adjacent stripe openings configures the light-shield area or masked area. The width of the stripe openings 71 is equal to the width of the space between adjacent openings 71, whereby the average opening ratio in the central portion of the pattern area 14 is 50%, with the opening ratio in the peripheral portion of the pattern area 14 being smaller than 50%.

Figure 5A:
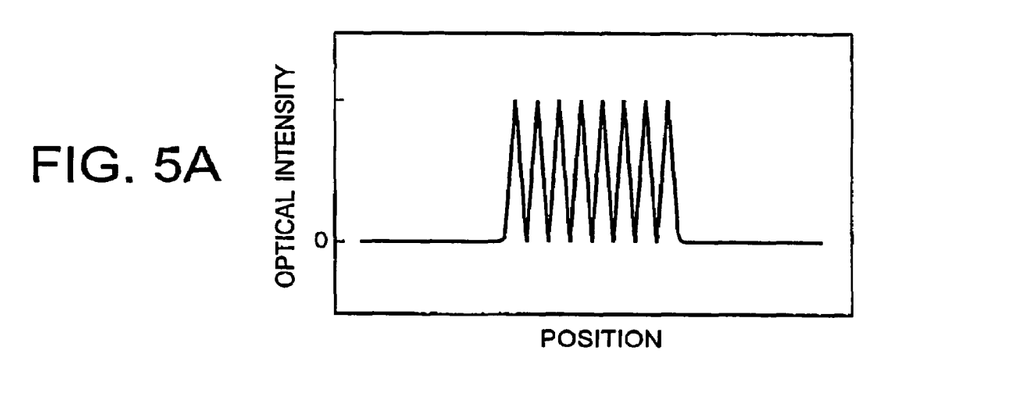
FIG. 5A is a graph showing the optical intensity distribution of the exposure light on the wafer in the case of using the reticle shown in FIG. 4.

The optical intensity distribution of the exposure light projected onto the wafer 21 is such that shown in FIG. 5A, wherein the portions of the wafer corresponding to the stripe openings 71 have a uniform peak optical intensity and a uniform minimum optical intensity. Since the light-shield film of the reticle 70 is made of chrome having a light transmittance factor of substantially zero, the minimum optical intensity in the masked area is substantially zero. The optical intensity distribution of the exposure light 52 is of a substantially triangular waveform, because the projection optical system 40 does not pass therethrough a higher-order diffracted light.

Figure 5B:
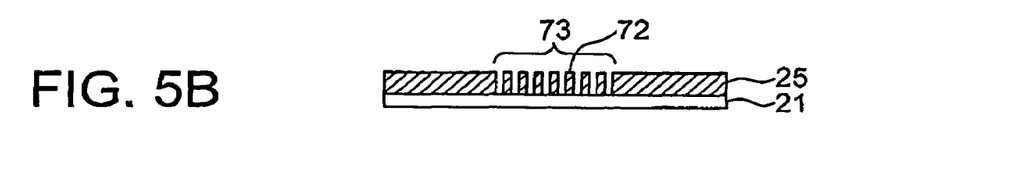
FIG. 5B is a sectional view of the resist pattern formed by the optical intensity distribution of the exposure light of FIG. 5A.

Assuming that only the exposure light 52 is incident onto the wafer surface, the photoresist pattern 25 formed after the development has uniform line width and uniform space width as shown in FIG. 5B, reflecting the optical intensity distribution of FIG. 5A having a uniform peak-to-peak optical intensity.

Figure 6:
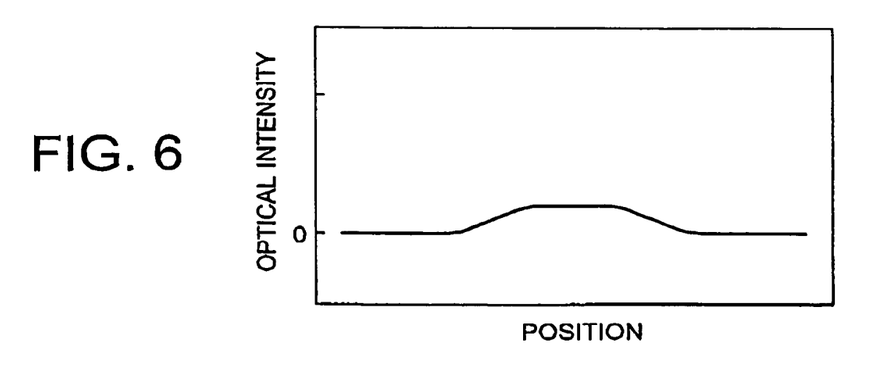
FIG. 6 is a graph showing the optical intensity distribution of the flare light on the wafer in the case of using the reticle shown in FIG. 4.

The influence by the flare light will be now described. FIG. 6A shows the optical intensity distribution of the flare light. As shown therein, the optical intensity of the flare light is higher in the central portion of the pattern area 14 due to the higher opening ratio, and reduces toward the periphery of the pattern area 14 due to the lower opening ratio. The optical intensity is of the flare light has a tendency of moderately reducing in the vicinity of the boundary between the pattern area 14 and the light-shield area 16 toward the peripheral masked area 16.

Figure 7A:
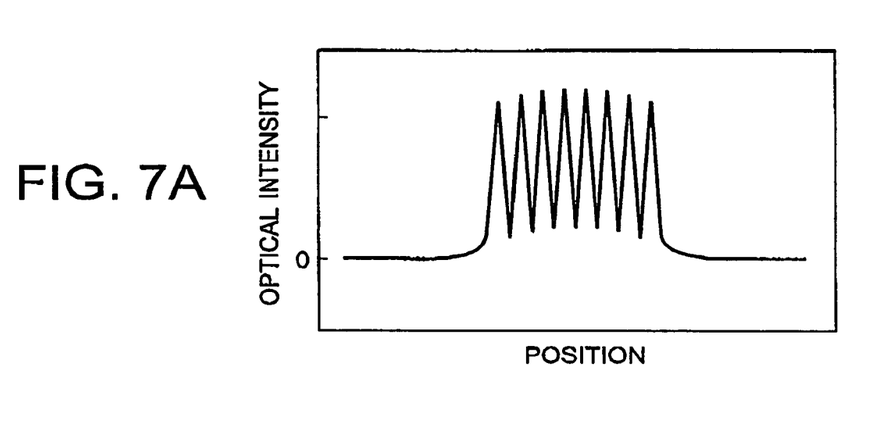
FIG. 7A is a graph showing the optical intensity distribution of the total of the exposure light and the flare light in the case of using the reticle shown in FIG. 4.
Figure 7B:
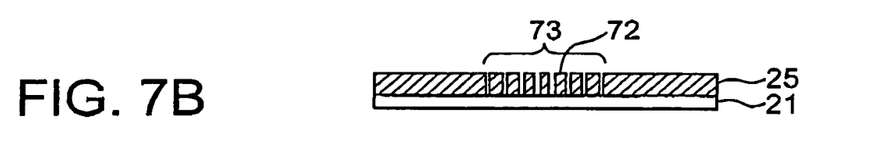
FIG. 7B is a sectional view of the resist pattern formed by the optical intensity distribution of FIG. 7A.

In the conventional optical aligner shown in FIG. 16, the total light incident onto the wafer surface is the superimposed light including the exposure light and flare light. FIG. 7A shows the sum of the optical intensity distribution of FIG. 5A and the optical intensity distribution of FIG. 6, representing the total optical intensity distribution obtained by the conventional optical aligner 200 on the wafer surface. The optical intensity distribution of this total light is such that the peak optical intensity is higher in the central portion of the pattern area 14 and is lower in the peripheral portion of the pattern area 14. Thus, the width of the openings in the resist pattern 25 corresponding to the stripe openings 52 in the reticle 70 is larger in the central portion than in the peripheral portion. In other words, the width of the remaining patterns 72 is larger in the peripheral portion of the pattern area 73 than in the central area thereof in the resist pattern 25, as shown in FIG. 7B.

Figure 8:
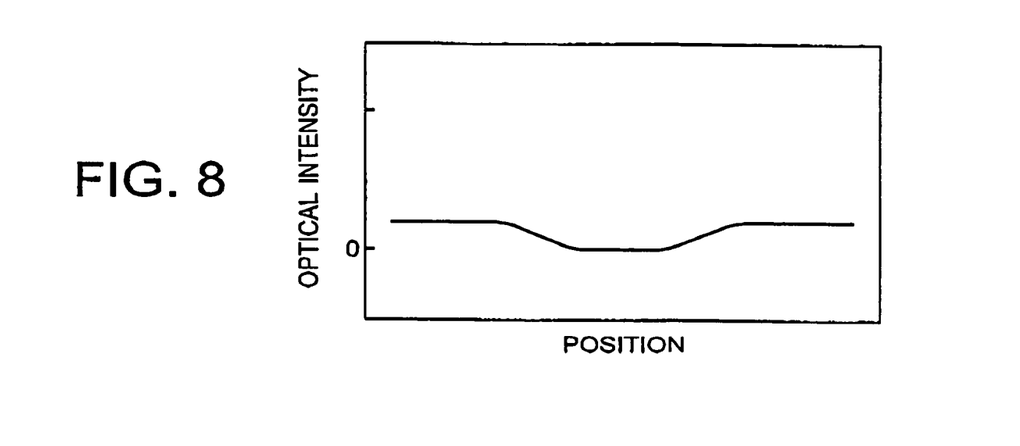
FIG. 8 is a graph showing the optical intensity distribution of the compensation light on the wafer in the case of using the reticle shown in FIG. 4.
Figure 9:
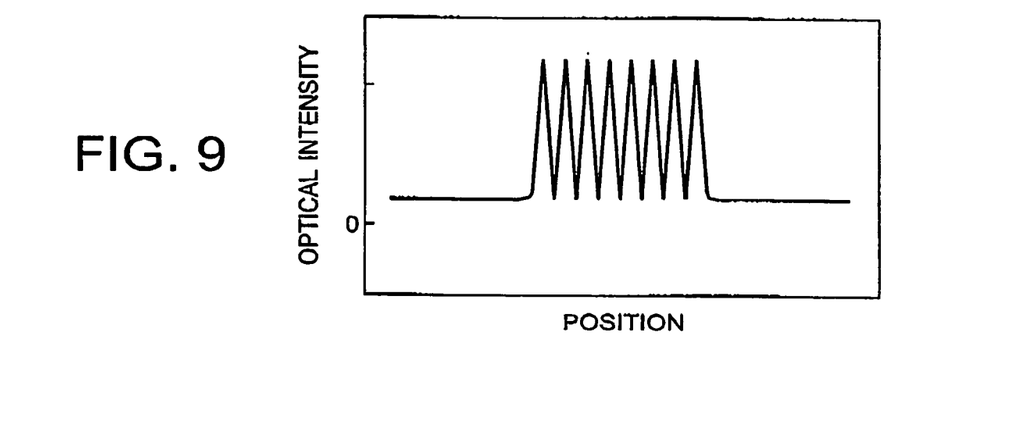
FIG. 9 is a graph showing the optical intensity distribution of the total of the exposure light, flare light and compensation light on the wafer in the case of using the reticle shown in FIG. 4.

On the other hand, in the optical aligner 100 of the present embodiment, the compensation optical system 60 provided therein compensates the flare light by providing a compensation light having an optical intensity distribution shown in FIG. 8. The optical intensity distribution of FIG. 8 is opposite to the optical intensity distribution of the flare light. Thus, the total light incident onto the wafer surface includes the exposure light, flare light and compensation light, resulting in the total optical intensity distribution such as shown in FIG. 9, which is substantially same as the optical intensity distribution shown in FIG. 5A. More specifically, the total optical intensity distribution has a uniform peak-to-peak intensity over the entire pattern area, whereby the optical intensity distribution is uniform over the stripe openings 71 in the resist pattern 70.

Thus, the stripes 72 of the photoresist pattern 25 have a uniform line width similarly to the stripes shown in FIG. 5B reflecting on the uniform peak intensity over the entire pattern area. It is to be noted that the optical intensity distribution is taken along line V-V of the pattern shown in FIG. 4.

Figure 10:
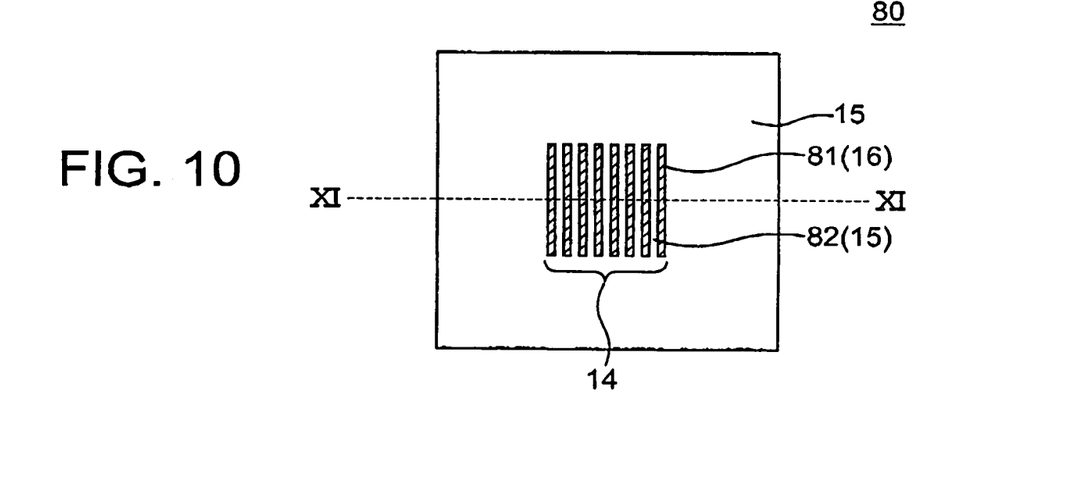
FIG. 10 is a top plan view of another example of the reticle pattern.

Another case is assumed in which the reticle 11 in the optical aligner 100 has a peripheral transparent area 15 and a central pattern area 14, as shown in FIG. 10. The line width of the masked stripes 81 is equal to the width of the transparent space 82 between adjacent masked stripes 81. In this case, the opening ratio is 50% in the central portion of the pattern area 14.

Figure 11A:
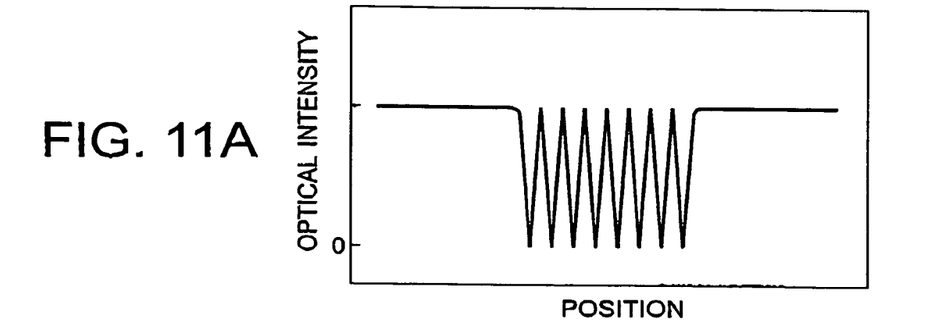
FIG. 11A is a graph showing the optical intensity distribution of the exposure light on the wafer in the case of using the reticle shown in FIG. 10.

The optical intensity distribution of the exposure light projected onto the wafer surface is such that shown in FIG. 11A, and has a zero optical intensity corresponding to the center of each masked stripe 81 and has a uniform peak-to-peak optical intensity over the entire transparent spaces 81. Assuming that only the exposure light is incident onto the wafer, the stripe patterns 83 formed on the wafer 21 is such that shown in FIG. 11B, wherein the stripes have a uniform line width corresponding to the uniform peak-to-peak optical intensity distribution of the exposure light after the development of the photoresist film due to the zero optical transmittance of the masked area.

Figure 12:
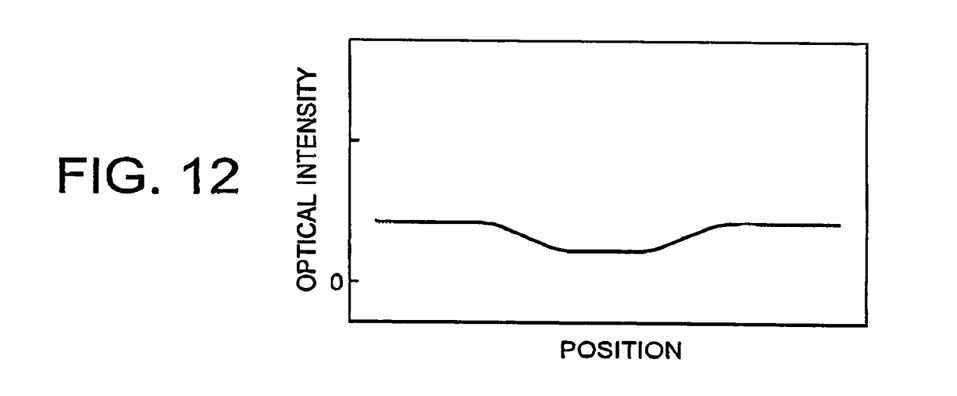
FIG. 12 is a graph showing the optical intensity distribution of the flare light on the wafer in the case of using the reticle shown in FIG. 10.

In the case of the mask pattern shown in FIG. 10, the flare light has an optical intensity distribution such as shown in FIG. 12, wherein the optical intensity is lower in the central portion of the pattern area 14 due to a smaller opening ratio therein, and is higher in the peripheral portion of the pattern area 14 due to a higher opening ratio therein.

Figure 13A:
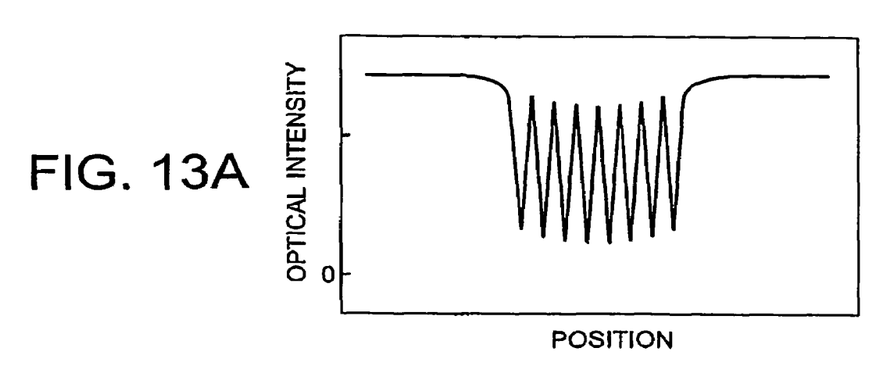
FIG. 13A is a graph showing the optical intensity distribution of the total of the exposure light and the flare light in the case of using the reticle shown in FIG. 10.
Figure 13B:
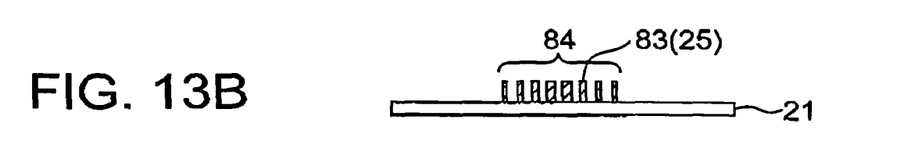
FIG. 13B is a sectional view of the resist pattern formed by the optical intensity distribution of FIG. 13A.

In the conventional optical aligner shown in FIG. 16, is the total light includes the superposed light including the exposure light and flare light, whereby the total optical intensity distribution is such that shown in FIG. 13A, wherein the optical intensity is higher in the peripheral portion than in the central portion of the pattern area 14. This optical distribution leads to the stripe pattern of the photoresist film shown in FIG. 13B, wherein the stripes 84 have a larger width in the central portion than in the peripheral portion of the photoresist pattern 84.

Figure 14:
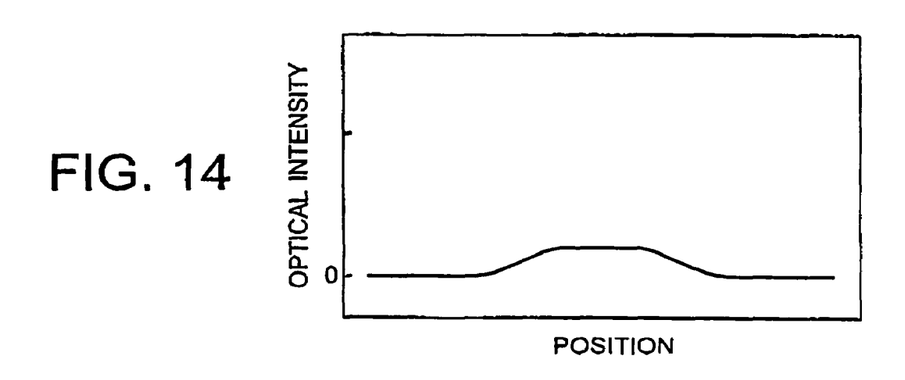
FIG. 14 is a graph showing the optical intensity distribution of the compensation light on the wafer in the case of using the reticle shown in FIG. 10.
Figure 15:
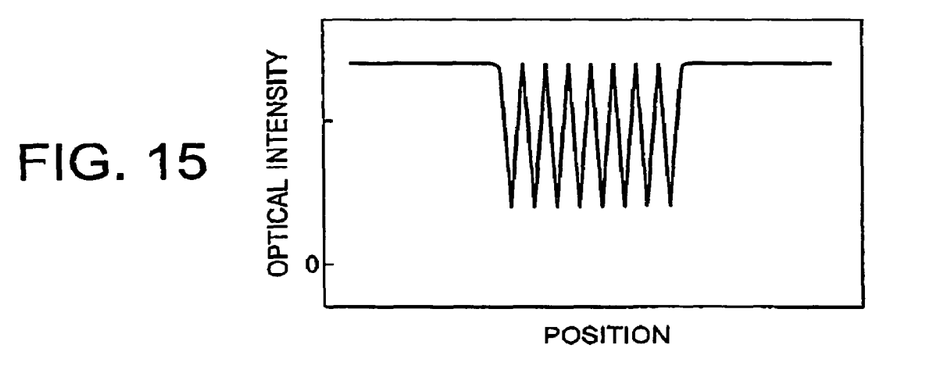
FIG. 15 is a graph showing the optical intensity distribution of the total of the exposure light, flare light and compensation light on the wafer in the case of using the reticle shown in FIG. 10.

On the other hand, in the optical aligner of the present embodiment, the compensation optical system 60 supplies a compensation light having an optical intensity distribution such as shown in FIG. 14, wherein the compensation light has a higher optical intensity in the central portion than in the peripheral portion of the pattern area 14 of the reticle 80. Thus, the compensation light compensates or cancels the flare light, thereby allowing substantially only the exposure light to be incident onto the photoresist film. Thus, the light incident onto the wafer 21 has a substantially uniform peak-to-peak optical intensity distribution, such as shown in FIG. 15.

Figure 11B:
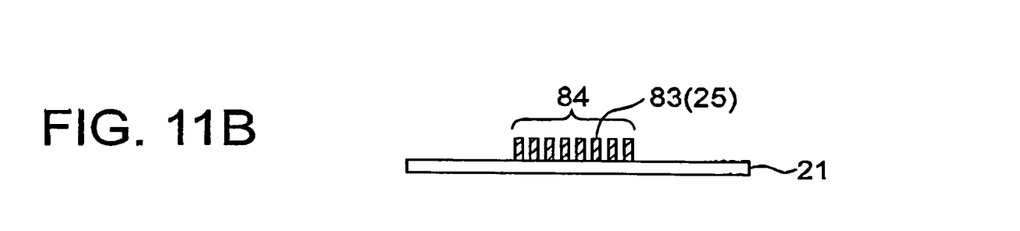
FIG. 11B is a sectional view of the resist pattern formed by the optical intensity distribution of the exposure light of FIG. 11A.

Thus, the photoresist pattern has a substantially uniform line width over the entire stripes similar to the stripes shown in FIG. 11B, obtained only by the exposure light. The optical intensity distribution diagrams shown in FIGS. 11 to 15 are taken along line XI-XI shown in FIG. 10. It is to be noted that the compensation light need not have an absolute optical intensity equal to the optical intensity of the flare light in the present invention, and it is sufficient for the compensation light to compensate at least some of the optical intensity of the flare light.

Figure 2:
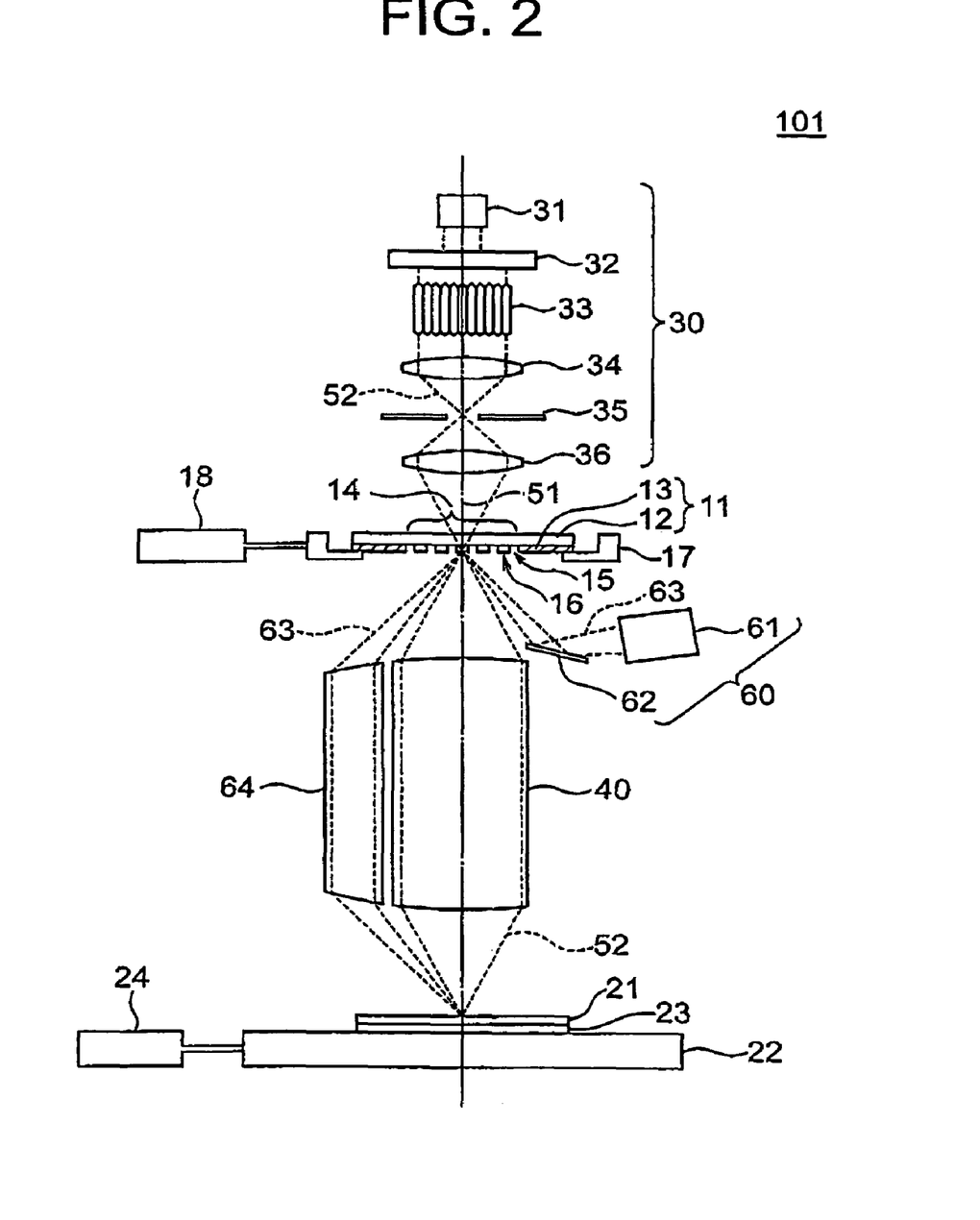
FIG. 2 is a sectional view of an optical aligner according to a modification from the optical aligner of FIG. 1.

FIG. 2 shows an optical aligner according to a first modification from the optical aligner shown in FIG. 1. The optical aligner 101 of this modification is similar to the optical aligner of FIG. 2 except that the compensation optical system 60 in this modification includes a separate projection optical system 64. The projection optical s system 64 of the compensation optical system 60 is disposed opposite to the compensation light source 61 with respect to the optical axis 51 of the exposure light 52 in the projection optical system 40.

According to this modification, the projection optical system 64 of the compensation optical system 60 can be designed separately from the projection optical system 40 for the exposure light 52. For example, the compensation optical source 61 may use a separate light source having a variety of wavelengths within the range of the photosensitive wavelength of the photoresist, and may be an i-line mercury lamp (365 nm), a g-line mercury lamp (438 nm), a KrF excimer laser (248 nm), an ArF excimer laser (193 nm), a F2 excimer laser (157 nm), a Kr2 excimer laser (146 nm), an Ar2 excimer laser (126 nm), a XeCl dielectric-barrier discharge lamp (308 nm), a KrCl dielectric-barrier discharge lamp (222 nm), Xe2 dielectric-barrier discharge lamp (172 nm) etc.

Figure 3:
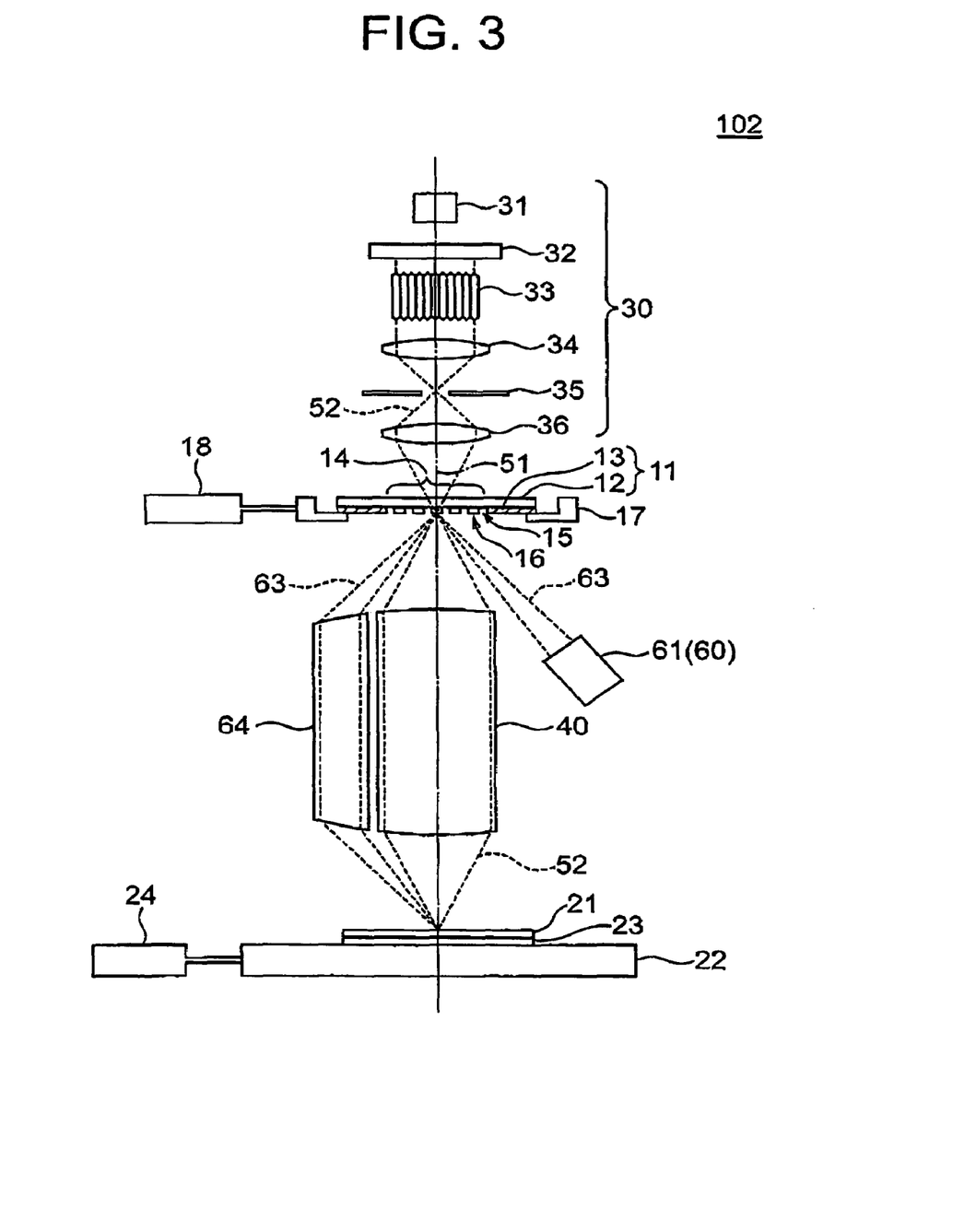
FIG. 3 is a sectional view of an optical aligner according to another modification from the optical aligner of FIG. 1.

FIG. 3 shows an optical aligner according to a second modification from the optical aligner 101 of FIG. 2. The optical aligner 102 of this modification is similar to the optical aligner 101 of FIG. 2 except that the compensation optical source 61 emits the compensation light directly toward the reticle 11. Without using the mirror, the optical aligner 101 of FIG. 3 saves the cost thereof.

In the above embodiment, the light shield pattern of the reticle 11 is made of chrome having an optical transmission factor of substantially zero percent. However, the light shield pattern may be made of a metal oxide, a metal nitride, or a metal fluoride having an optical transmittance factor of several percents, for example. The photoresist film may be made of negative photoresist other than the positive photoresist. The exposure light source may be other than the ArF excimer laser.

It is to be noted the term "mask" in the present invention includes a substrate on which a reference pattern is formed, such as a reticle and a photomask.

It is preferable that the compensation light be reflected by the light-shield area of the mask to be incident onto the photoreceptor. In this case, the compensation light has an optical intensity distribution substantially opposite to the optical intensity distribution of the flare light, whereby the compensation light can be adjusted to substantially cancel the flare light.

The compensation light may be guided by the projection optical system, or the compensation optical system may include a compensation projection optical system for transmitting the compensation light from the mask to the photoreceptor.

It is also preferable that the compensation light be reflected by a mirror toward the mask. The photoreceptor may be a positive or negative photoresist film formed on a wafer.

Since the above embodiments are described only for examples, the present invention is not limited to the above embodiments and various modifications or alterations can be easily made therefrom by those skilled in the art without departing from the scope of the present invention.

What is claimed is:

1. An optical aligner comprising: a light source for generating an exposure light; an irradiation optical system for irradiating said exposure light onto a mask having a light-shield area and a transparent area; a projection optical system for transmitting said exposure light passed by said mask toward a photoreceptor to thereby project an image of said mask onto said photoreceptor; and a compensation optical system for transmitting a compensation light onto said photoreceptor, wherein said compensation light has a first optical intensity distribution different from a second optical intensity distribution of a flare light generated from said exposure light.

2. The optical aligner according to claim 1, wherein said compensation light is reflected by said light-shield area of said mask to be incident onto said photoreceptor.

3. The optical aligner according to claim 2, wherein said compensation light is guided by said projection optical system.

4. The optical aligner according to claim 2, wherein said compensation optical system includes a compensation projection optical system for transmitting said compensation light from said mask to said photoreceptor.

5. The optical aligner according to claim 2, wherein said compensation light is reflected by a mirror toward said mask.

6. The optical aligner according to claim 1, wherein said photoreceptor is a positive or negative photoresist film formed on a wafer.

7. The optical aligner according to claim 1, wherein said first optical intensity distribution is substantially opposite to said second optical intensity distribution.

8. A method comprising the steps of:
   irradiating an exposure light onto a mask having a light-shield area and a transparent area, to project an image of said mask onto a photoreceptor; and
   irradiating a compensation light onto said photoreceptor, wherein said compensation light has a first optical intensity distribution different from a second optical intensity distribution of a flare light generated from said exposure light.

9. The method according to claim 8, wherein said compensation light is reflected by said light-shield area of said mask to be incident onto said photoreceptor.

10. The method according to claim 9, wherein said photoreceptor is a photoresist film formed on a wafer.

11. The method according to claim 9, wherein said first optical intensity distribution is substantially opposite to said second optical intensity distribution.

\* \* \* \* \*